United States Patent
Lien et al.

(10) Patent No.: US 7,204,017 B2
(45) Date of Patent: Apr. 17, 2007

(54) MANUFACTURING METHOD OF A MODULARIZED LEADFRAME

(75) Inventors: Jeffrey Lien, Taipei (TW); Shihlin Chang, Xindian (TW)

(73) Assignee: Optimum Care International Tech. Inc., Taipei (TW)

( * ) Notice: Subject to any disclaimer, the term of this patent is extended or adjusted under 35 U.S.C. 154(b) by 86 days.

(21) Appl. No.: 10/959,205

(22) Filed: Oct. 7, 2004

(65) Prior Publication Data
US 2005/0125999 A1    Jun. 16, 2005

(30) Foreign Application Priority Data
Dec. 10, 2003    (TW)    .............................. 92134933 A

(51) Int. Cl.
*H01R 43/00*    (2006.01)
(52) U.S. Cl. ............................ 29/827; 29/832; 29/841; 29/856; 257/676; 257/690; 438/112; 438/123
(58) Field of Classification Search .................. 29/827, 29/830, 832, 838–841, 854–858; 257/666, 257/673, 676, 678, 687, 690; 438/106, 111, 438/112, 123, 124, 126
See application file for complete search history.

(56) References Cited

U.S. PATENT DOCUMENTS

| | | | | | |
|---|---|---|---|---|---|
| 5,302,849 | A | * | 4/1994 | Cavasin | ........................ 257/666 |
| 6,333,211 | B1 | * | 12/2001 | Sato et al. | .................... 438/126 |
| 6,847,103 | B1 | * | 1/2005 | Perez et al. | .................. 257/676 |

* cited by examiner

*Primary Examiner*—Minh Trinh
*Assistant Examiner*—Donghai D. Nguyen

(57) ABSTRACT

A manufacturing method of a modularized leadframe, using a first mold set to contact and hold the upper surface of rows of multiple block leads, using a second mold set to contact and hold at least one selected surface of the lower surface of leads, the second mold set has a protruding part between each row of leads so that the upper surface of the protruding part be in close contact with the inner surface of the first mold set. The hollow space between the mold sets is then injected with packaging materials such that a leadframe structure having packaged and fixed leads therein and surfaces for wire-bonding and soldering is obtained. A packaging material filling space is formed in the leadframe after removing the first and the second mold sets.

5 Claims, 6 Drawing Sheets

MANUFACTURING METHOD OF A MODULARIZED LEADFRAME

BACKGROUND OF THE INVENTION

1. Field of the Invention

This invention relates to a manufacturing method and design of modularized leadframe, more specifically relates to pre-packaged leads, which can be used for selectively supplying a leadframe package semi-product or for further designing product with chip attached.

2. Description of the Related Art

As shown in FIG. 1, in conventional package structure, a semiconductor chip 10 is enclosed in a thermo-setting or ceramic material package body 20 to form a hermetic seal. Leads 30 (leadframe) on both sides of the semiconductor chip 10 extend out the package body 20 such that the bottom surface 301 of the leads 30 can be used as a soldering part connecting to the printed circuit board, but this package structure suffers a drawback of too bulky; therefore, another package technology emerges where leads are only exposed at the bottom surface of the package body as a soldering surface, as shown in FIG. 2, here a semiconductor chip 10' is seated or attached on leads 30', then an encapsulated body 20' is used to enclose the structure to form a hermetic package, the bottom surface 301' of the leads 30' are exposed and in the same plane with the bottom surface of encapsulated body 20', this surface 301' can be used as a soldering part connecting to the printed circuit board, a further improvement on package size reduction can thus be obtained.

But the above-mentioned wholly-packaged semiconductor structure suffers a drawback that it can not arbitrarily select the wire-bonding methods or a wire-bonding operation can not be performed according to actual needs or it is impossible to change leads number after packaging, therefore this kind of product is less flexible. Furthermore, the bottom surface 301' of the leads 30' are exposed and in the same plane with the bottom surface of encapsulated body 20', this easily leads to the penetration of encapsulated material 20' into the bottom surface 301' before it is solidified, which in turn form defective and need to be trimmed, production cost and quality control cost are thus increased. Moreover, normally chip has been packaged before it comes to assembly house, in addition, the assembly of semiconductor electronic components onto printed circuit board is in a sealing status, the above-mentioned packaging operation which uses expensive packaging material results in the difficulty of lowering packaging production cost.

SUMMARY OF THE INVENTION

The main purpose of this invention is to provide a manufacturing method for modularized leadframe, using a first mold set to contact and hold the upper surface of rows of multiple block leads such that an uncovered, clean, and shiny surface is formed after packaging; using a second mold set to contact and hold at least one selective surface of the lower surface of leads such that an uncovered, clean, and shiny surface is formed after packaging, wherein the second mold set has a protruding part which is located between rows of leads so that the upper surface of the protruding part be in close contact with the inner surface of the first mold set; then injecting the hollow space formed from the mold sets with packaging materials to form a leadframe structure having leads fixed therein, a wire-bonding surface, and an exposed soldering surface; then removing the first and the second mold sets to leave a space in the leadframe for later wire-bonding and simple sealing operation after chip is attached in the space.

Another purpose of this invention is to provide a modularized leadframe is characterized that block leads of the leadframe comprises an upper and a lower surfaces and a middle upward dented wire-bonding surface, wherein the lower surface and wire-bonding surface are pasted and held by second mold set such that when packaged it can form exposed wire-bonding surface and soldering surface for attaching to components such as printed circuit board.

BRIEF DESCRIPTIONS OF THE DRAWINGS

DETAILED DESCRIPTION OF THE PREFERRED EMBODIMENT

Figure 1:
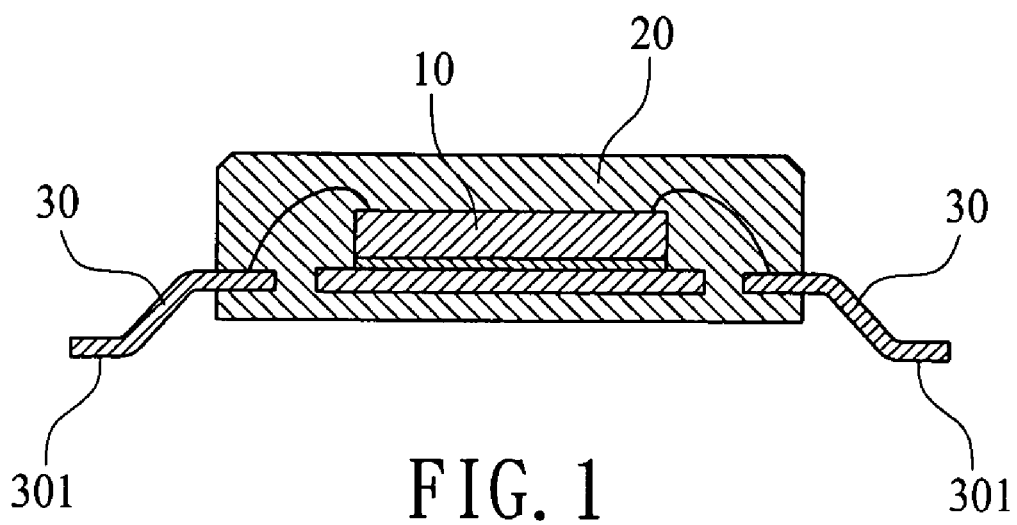
FIG. 1 shows the semiconductor package structure of prior art.
Figure 2:
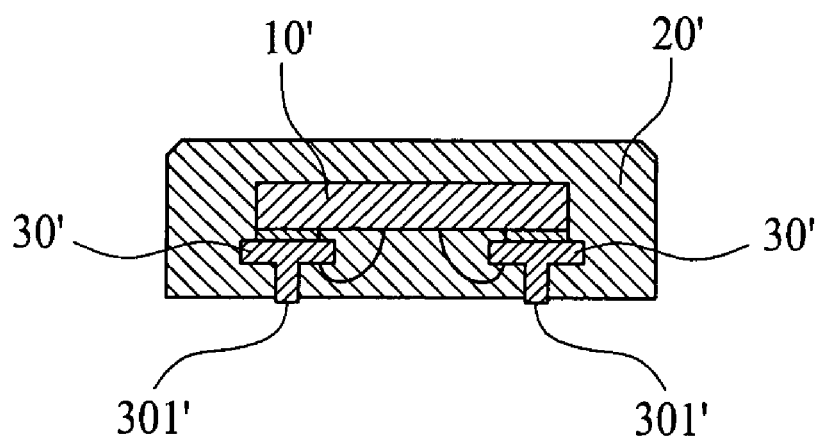
FIG. 2 shows another semiconductor package structure of prior art.
Figure 3:
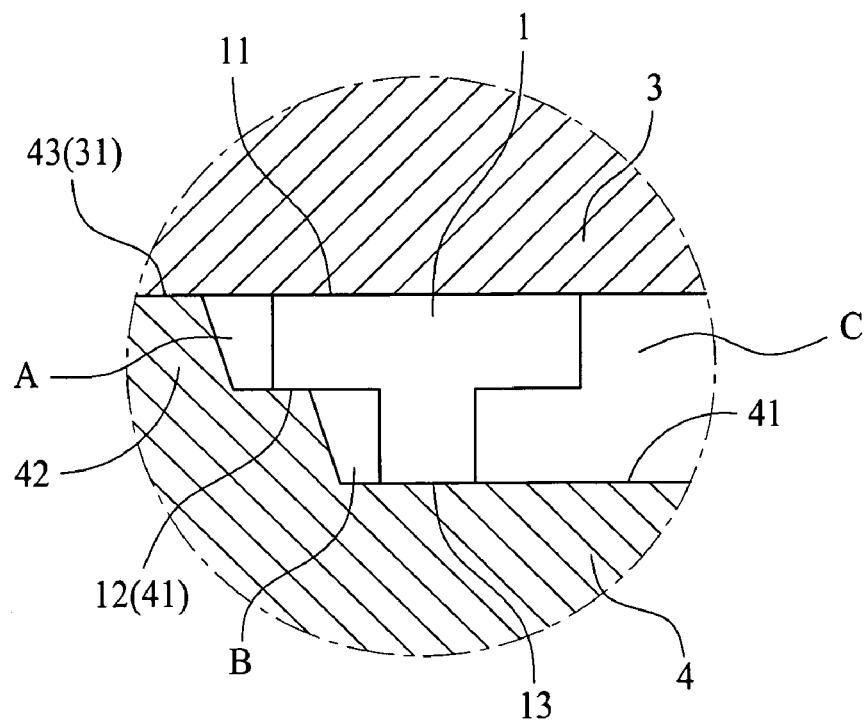
FIG. 3 shows the manufacturing process of the present invention in which leads are put in the first and the second mold sets.
Figure 4:
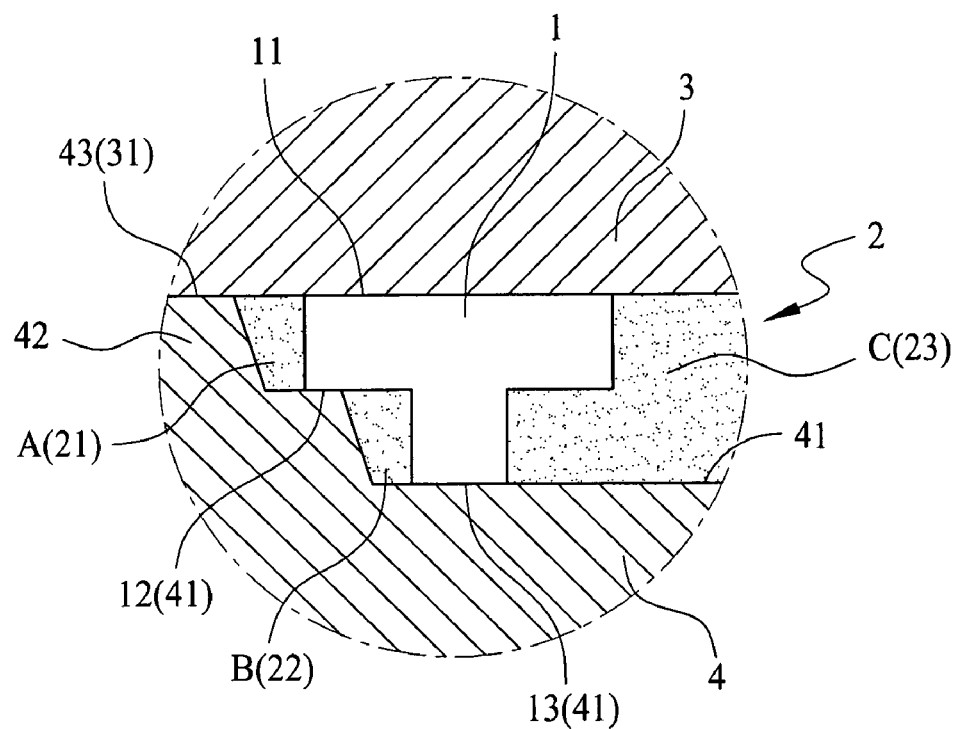
FIG. 4 shows the manufacturing process of the present invention in which an encapsulating material is injected into the space formed by the mold sets.
Figure 5:
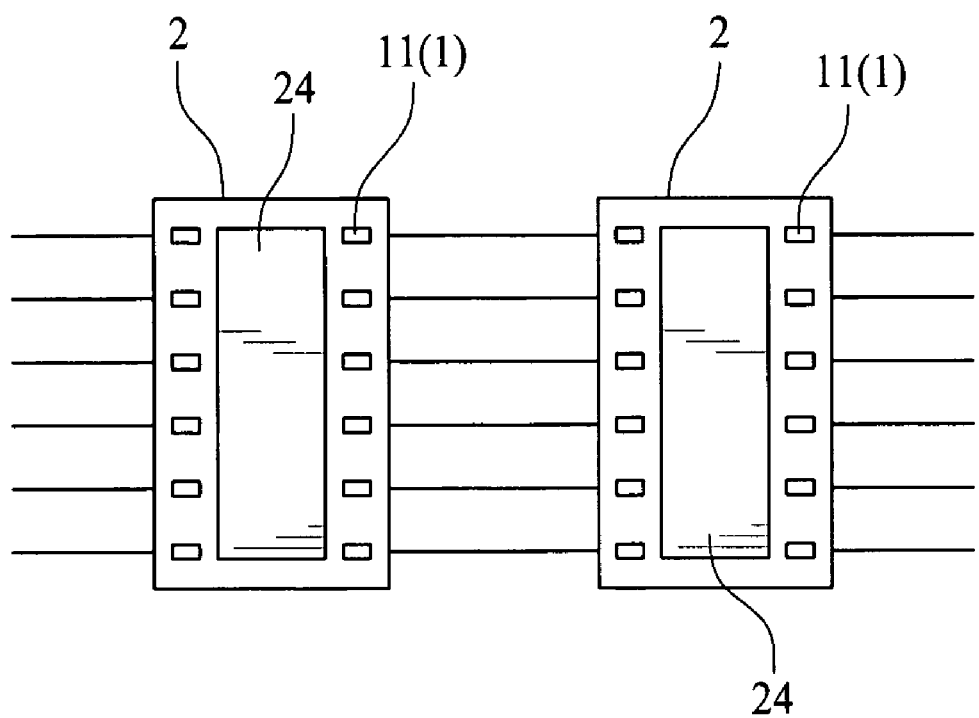
FIG. 5 shows the top view of one embodiment of the leadframe manufactured by the manufacturing method of the present invention.
Figure 6:
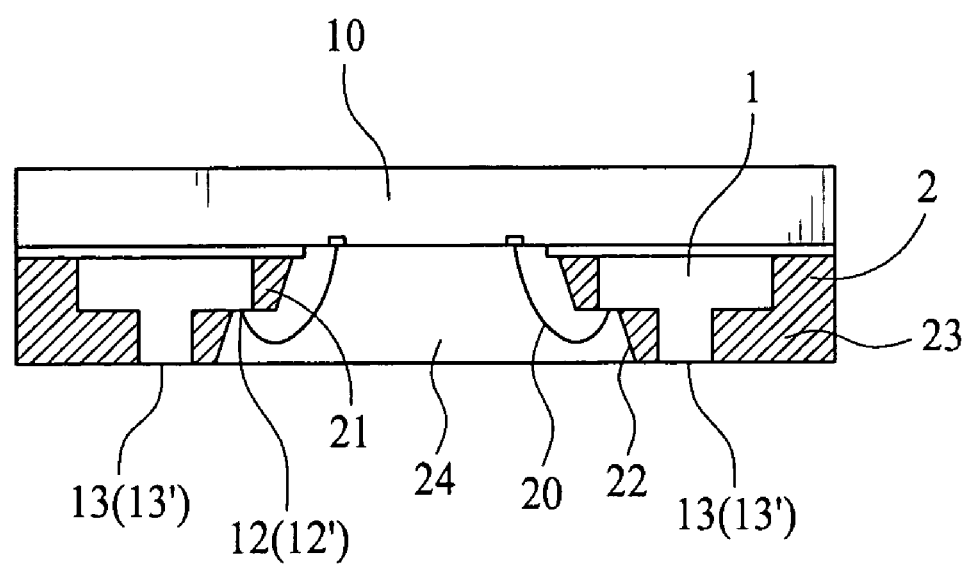
FIG. 6 shows a process for assembling chip onto the leadframe produced by the manufacturing process of the present invention in which a chip is placed on the leadframe and a wire is formed between the chip and the leadframe.
Figure 7:
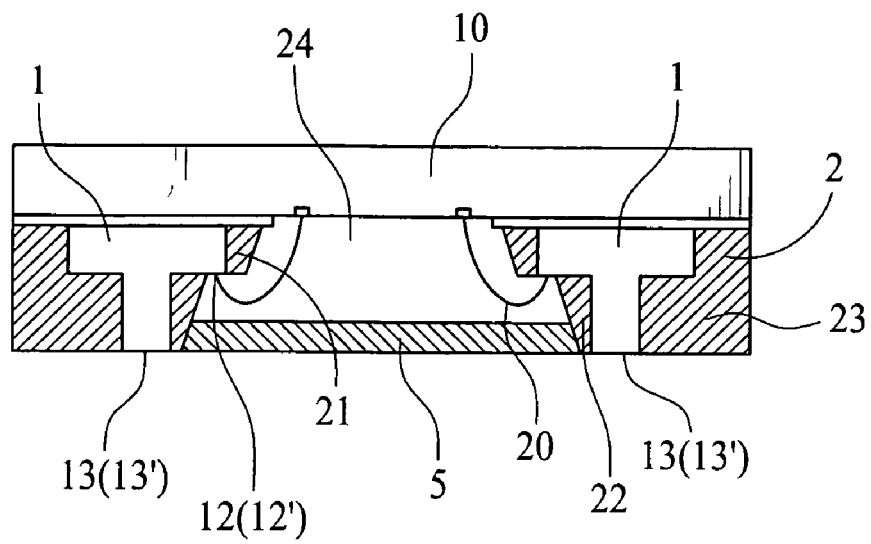
FIG. 7 shows a process for sealing the hollow part in the leadframe of the present invention.
Figure 8:
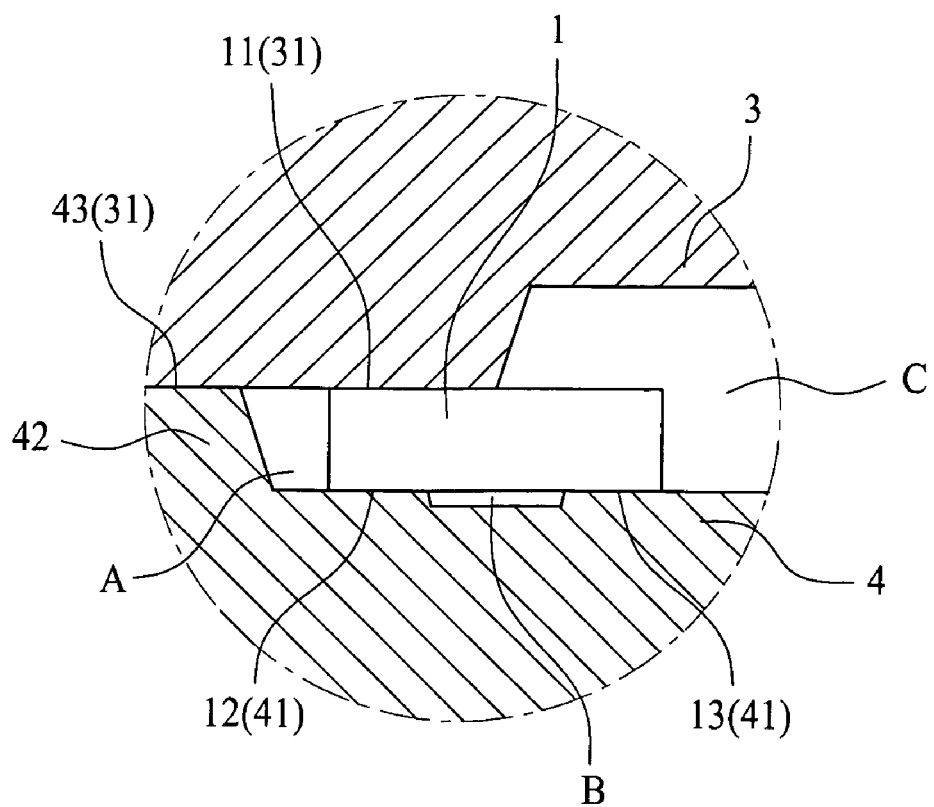
FIG. 8 shows another embodiment of the manufacturing process of the present invention in which leads are put in the first and the second mold sets.
Figure 9:
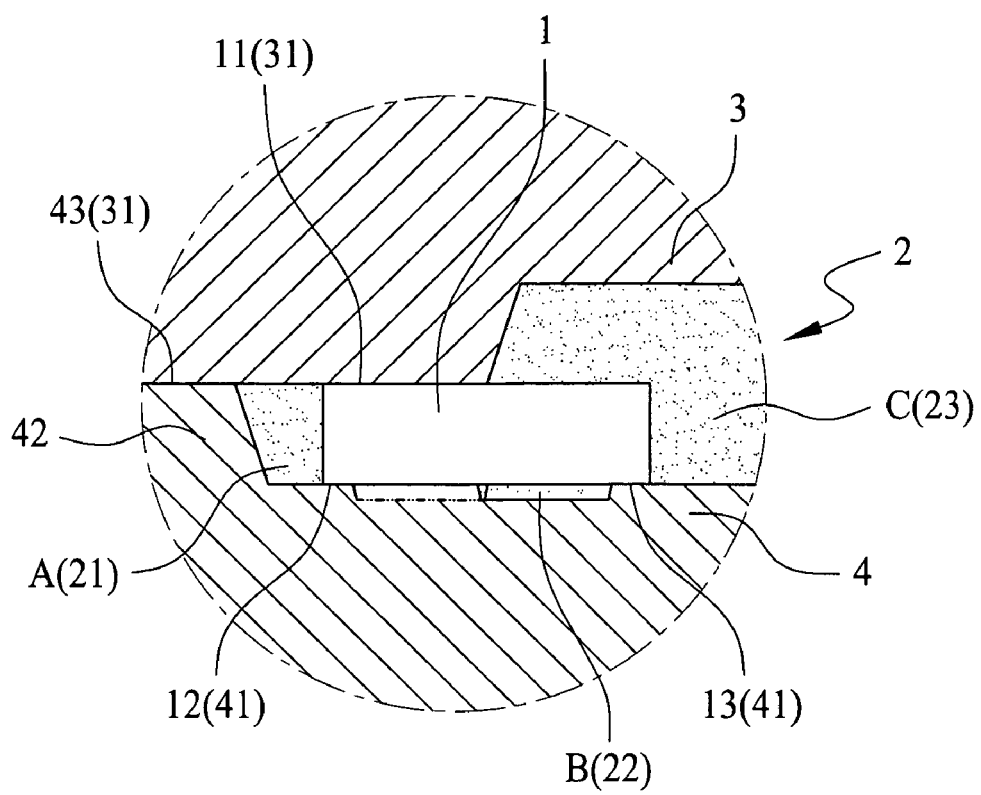
FIG. 9 shows another embodiment of the manufacturing process of the present invention in which an encapsulating material is injected into the space formed by the mold sets.
Figure 10:
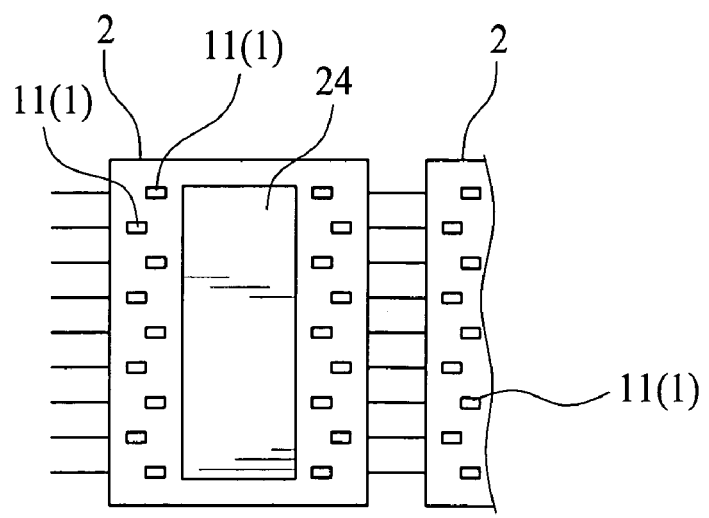
FIG. 10 shows the top side view for another embodiment of the leadframe of the present invention.
Figure 11:
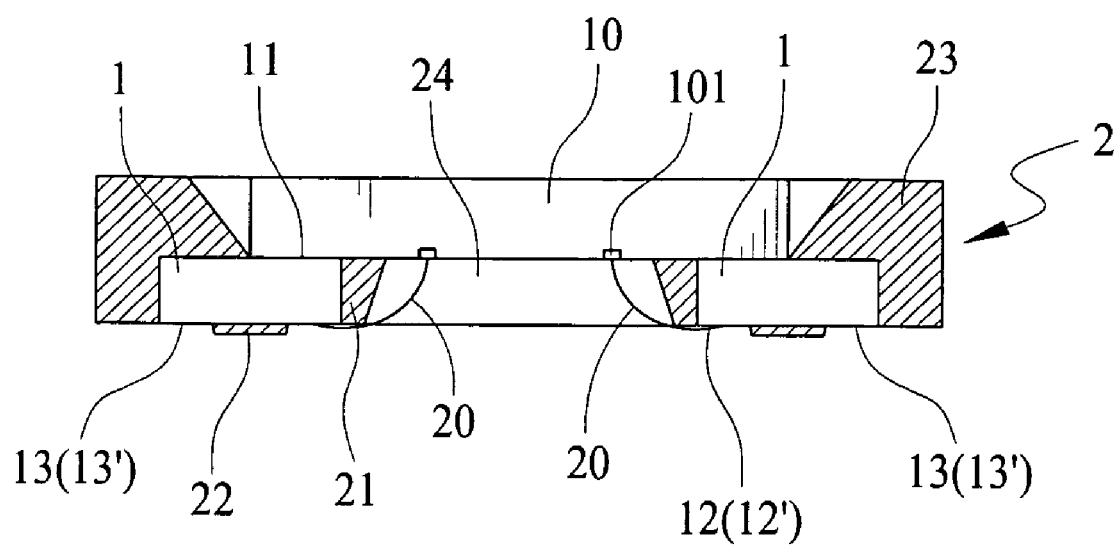
FIG. 11 shows another embodiment of the leadframe of the present invention where a chip is assembled onto the leadframe.
Figure 12:
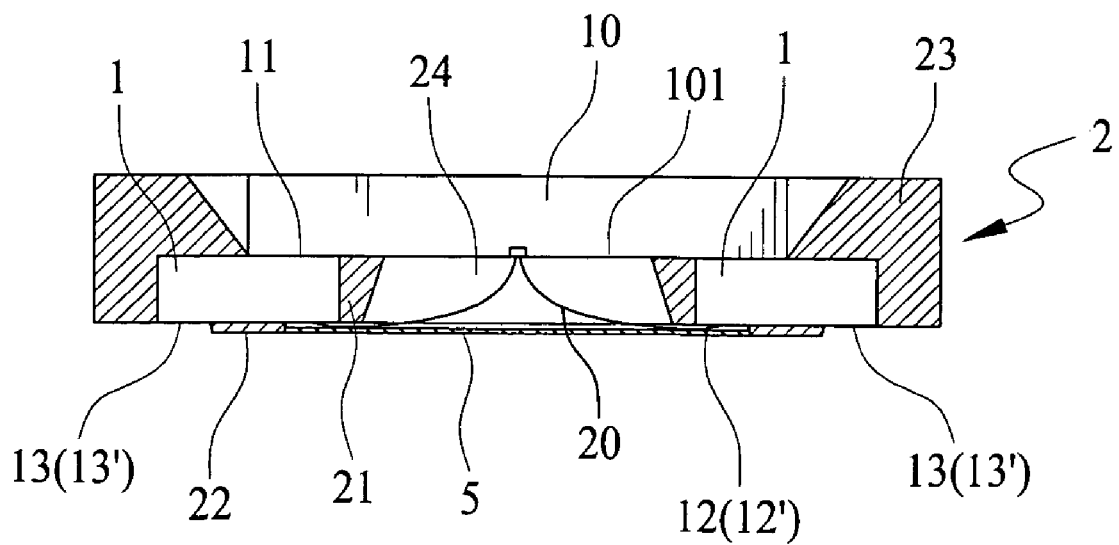
FIG. 12 shows another embodiment of the leadframe of the present invention where the hollow part in the leadframe is packaged.

The manufacturing methods, package structure of the present invention and its purposes are described in detail in the followings by referring to the attached embodiment figures:

As shown in the appended figures, the present invention relates to a manufacturing method for modularized leadframe, the modularized leadframe is a pre-packaged leadframe for further chip assembly and design of variable chip or leadframe such that a more flexible manufacturing method can be achieved, the method comprises:

(a) selecting multiple metallic block leads 1 which has been diced or not diced, arranging the leads 1 in at least two rows of symmetrical or asymmetrical arrangement (please refer to FIG. 6 or FIG. 10);

(b) contacting the inner surface 31 of a first mold set 3 with and holding the upper surface 11 of the leads 1 such that after packaging the upper surface 11 will be a shiny surfaces without being covered by any unwanted matter; then contacting the inner surface 41 of a second mold set 4 with and holding part surfaces 12, 13 (it can also be one selected surface) at the lower surface of the leads 11, which results in a non-covered and shiny surface after packaging, wherein the second mold set 4 forms a protruding part 42 which is located between each leads 1 such that the upper surface 43 of the protruding part 42 contact with the inner surface 31 of the first mold set 3 (as shown in FIG. 3 and FIG. 8); thus spaces A, B, C are respectively formed between the first and the second mold sets 3 and 4 and the leads 1;

(c) injecting packaging materials into the space A, B, C (as shown in FIG. 4 and FIG. 9) such that the leads 1 are packaged into an encapsulated body 2 with a fixed structure; after removing the first and the second mold sets, an inner fixing part 21 is formed in the material filled space A, a lower fixing part 22 is formed in the material filled space B and a side fixing part 23 is formed in the material filled space C, furthermore a hollow part 24 is formed between each row of leads 1, so that the upper surface 11 of lead 1 and at least one selected surface 12, 13 are exposed and the lower part of the surfaces 12, 13 can form a wire-bonding surface 12' and soldering surface 13', respectively, thus a leadframe which can accommodate chip 10 is formed (as shown in FIG. 5 and 10), a product that can provide a space for chip 10 is thus completed;

(d) attaching at least one chip 10 onto the upper surface of the above-mentioned fixed and packaged leadframe, performing wire-bonding operation with at least one metallic wire 20 for connecting the chip 10 and the wire-bonding surface 12' of lead 1 (that is, the originally selected surface), the wire bonding space is located at the hollow part 24 of encapsulated body 2 (as shown in FIG. 6 and FIG. 11), thus a product that is ready to go with flexible choices is formed, this product can be arbitrarily soldered directly onto a printed circuit board or other electrical device or other additional manufacturing processes can be performed on it;

(e) Please refer to FIGS. 7 and 12, the bottom surface hollow part 24 of the encapsulated body 2 can be selectively packaged for the second time after completing the wire-bonding operation or other sealing material 5 can be used to form hermetic structure; because chip 10 and lead 1 have been possessed into a package structure, which attains purposes of resistance to moisture and dust, therefore cheaper plastic material can be selected and used in performing second packaging operation such that production cost can be greatly reduced;

Leadframe products manufactured by the method disclosed in the present invention can thus be supplied to relative customers, and the customers can then use them to perform wire-bonding or soldering directly onto a printed circuit board, this product thus has much flexibility and is suitable to different applications as needed; moreover, because in the present invention, the inner surfaces 31, 41 of first and second mold sets 3, 4 contact to the upper surface 11 and lower selected surfaces 12, 13 of leads 1, the thermo-setting plastic or ceramic material will not penetrate into the upper surface 11 and the lower selected surface 12, 13 during packaging the leads 1, defects such as burrs will thus not appear on the exposed surface of leadframe product or semi-product and a trimming processes is not needed and its production and quality control cost can correspondingly be reduced; furthermore, because in the present invention, an upward hollow part 24 is formed on the bottom surface of encapsulated surface 2 when leads 1 is packaged completely, the bottom surface of chip 10 and the wire-bonding surface 12' of the leads 1 are thus exposed, metallic wire 20 can then be selectively used to connect the bottom surface of chip 10 and the wire-bonding surface 12' of the leads 1, then it is soldered to the printed circuit board directly, it thus greatly reduces packaging material cost, ordinary plastic sealing material or sealer 5 can be placed above the hollow part when the hollow part 24 is intended to be sealed, further saving in material cost can thus be achieved.

It is to be pointed out that the lower fixing part 22 formed in the above-mentioned encapsulated body 2 is located at the lower part of the leads 1, but the type it is formed at the lower part of leads 1 is not limited to align-to-each-other arrangement, it can be in cross and asymmetrical arrangement when the material filled space B is formed by the second mold set 4 (please refer to FIGS. 8 and 9), the reason of doing such arrangement is to separate the exposed wire-bonding surface 12' and soldering surface 13' in order to reduce electromagnetic interference (EMI) effect; in the same way, the leads 1 mentioned above can also be in a stagger and asymmetrical arrangement such that wire-bonding surface 12' and soldering surface 13' are well separated (please refer to FIG. 10), the same effect can be achieved, for those skilled in the art, any simple modification or variation may be made therein without departing from the spirit of the invention or from the scope of the appended claims.

Summarize the above descriptions, current invention of "The manufacturing method of a modularized leadframe" does possess the required properties of utility and invention, its embodiments are also inventive, we therefore submit a new type patent application.

What the invention claimed is:

1. A manufacturing method of a modularized leadframe comprising:
   (a) selecting multiple metallic block leads forming at least an arrangement of two rows;
   (b) contacting and holding the upper surface of row of multiple leads with the inner surface of a first mold set, contacting and holding at least a selected surface on the lower part of the leads with the inner surface of a second mold set, wherein the second mold set has a protruding part which is positioned between the leads of each row of lead and contacting an upper surface of the protruding part with the inner surface of the first mold set during the holding so as to leave a space for bonding a wire connecting a chip and the lead after removing the two mold sets;
   (c) injecting packaging materials into the space formed between the two mold sets, forming an encapsulated body in which the leads are fixed and packaged; removing the first and the second mold sets to leave the space between the leads for bonding the wire connecting chip and the lead; wherein at least the upper surface of the leads and at least the lower surface of the leads are exposed and the exposed upper surface is provided for placing the chip and part of the exposed lower surface is provided for bonding a conductive wire with the chip and part of the exposed lower surface is provided for soldering with a printed circuit board (PCB).

2. The manufacturing method of a modularized leadframe of claim 1, wherein the surface of the leads connecting the conductive wire with the chip is located within the packaging material filling space.

3. The manufacturing method of a modularized leadframe of claim 1, wherein the encapsulated body is subjected to a second time packaging after completing the wire-connecting operation between the chip and the leads.

4. The manufacturing method of a modularized leadframe of claim 1, wherein the leads are in symmetrical or stagger asymmetrical arrangement before packaging operation.

5. The manufacturing method of a modularized leadframe of claim 1, wherein the lower part of leads contacted and held by the inner surface of second mold set has at least one selected surface which can be packaged in symmetrical or stagger asymmetrical arrangement.

* * * * *